United States Patent [19]
Gilbert et al.

[11] Patent Number: 5,349,224
[45] Date of Patent: Sep. 20, 1994

[54] INTEGRABLE MOS AND IGBT DEVICES HAVING TRENCH GATE STRUCTURE

[75] Inventors: Percy V. Gilbert, Austin, Tex.; Gerold W. Neudeck, West Lafayette, Ind.

[73] Assignee: Purdue Research Foundation, West Lafayette, Ind.

[21] Appl. No.: 85,845

[22] Filed: Jun. 30, 1993

[51] Int. Cl.$^5$ .............................. H01L 27/02
[52] U.S. Cl. ..................... 257/333; 257/341; 257/378; 257/377; 257/401; 257/577; 437/40; 437/67; 437/90; 437/203; 437/225; 437/913
[58] Field of Search ............... 257/333, 341, 378, 397, 257/401, 577; 437/40, 67, 90, 203, 225, 913

[56] References Cited

U.S. PATENT DOCUMENTS

| | | | |
|---|---|---|---|
| 4,683,643 | 8/1987 | Nakajima et al. | 437/203 |
| 4,786,953 | 11/1988 | Morie et al. | 357/23.4 |
| 5,023,196 | 1/1991 | Johnsen et al. | 437/40 |
| 5,032,888 | 7/1991 | Seki | 357/37 |
| 5,045,903 | 9/1991 | Meyer et al. | 357/23.4 |
| 5,072,266 | 12/1991 | Bulucea | 357/23.4 |
| 5,108,937 | 4/1992 | Tsai et al. | 437/40 |
| 5,134,448 | 7/1992 | Johnsen et al. | 357/23.4 |
| 5,142,640 | 8/1992 | Iwamatsu | 357/23.6 |
| 5,164,325 | 11/1992 | Cogan et al. | 437/29 |
| 5,168,331 | 12/1992 | Yilmaz | 257/331 |

FOREIGN PATENT DOCUMENTS

| | | |
|---|---|---|
| 0494597 | 2/1992 | European Pat. Off. |
| 3-50771 | 3/1991 | Japan . |
| 4142078 | 5/1992 | Japan . |

OTHER PUBLICATIONS

Gilbert, et al., "A Fully Integrable Insulated Gate Bipolar Transistor with a Trench Gate Structure," 5th Inter-
(List continued on next page.)

*Primary Examiner*—Edward Wojciechowicz
*Attorney, Agent, or Firm*—Townsend and Townsend Khourie and Crew

[57] ABSTRACT

A power semiconductor device which is integrable in an integrated circuit includes a semiconductor body having first and second major opposing surfaces with a first doped region of a first conductivity type therebetween, second and third doped regions of a second conductivity type formed in the first doped region, the second and third doped regions being spaced apart and abutting the first surface, and fourth and fifth doped regions of the first conductivity type respectively formed in the second and third doped regions and abutting the first surface. Sixth and seventh doped regions extend from the first surface into the first region, the sixth region being adjacent to the second and fourth regions and spaced therefrom by an electrically insulative layer, the seventh region being adjacent to the third and fifth regions and spaced therefrom by an insulative layer. The first doped region extends toward the first surface between the sixth and seventh regions and separated therefrom by an electrically insulative layer of variable thickness suitable for voltage blocking. An eighth doped region in the first doped region between the sixth and seventh regions abuts the first surface and forms the drain of a MOSFET or the anode of an IGBT. In fabricating the device, reactive ion etching is used to from a trench in which the sixth and seventh regions are formed. The trench is filled by epitaxially grown semiconductor material in which the eighth doped region is formed. The fourth and fifth doped regions form the source of a MOSFET or a cathode of an IGBT. All ohmic contacts to the device can be made on the first surface.

24 Claims, 5 Drawing Sheets

OTHER PUBLICATIONS national Symposium on Power Semiconductor Devices and ICs, May 18–20, 1993, Monterey, Calif., pp. 240–245.

Shenai, "Optimized Trench MOSFET Technologies for Power Devices," IEEE Transactions on Electron Devices, vol. 39, No. 6, Jun. 1992, pp. 1435–1443.

Syau, "Extended Trench-Gate Power UMOSFET Structure With Ultralow Specific On-Resistance," Electronics Letters, Apr. 23, 1992, vol. 28, No. 9, pp. 865–867.

Matsumoto, et al., "Ultralow Specific On Resistance UMOSFET With Trench Contacts for Source and Body Regions Realised by Selfaligned Process," Electronics Letters, Aug. 29, 1991, vol. 27, No. 18, pp. 1640–1542.

Baliga, "An Overview of Smart Power Technology," IEEE Transactions on Electron Devices, vol. 38, No. 7, Jul. 1991, pp. 1568–1575.

Hamamoto, "Sidewall Damage in a Silicon Substrate Caused by Trench Etching," Applied Physics Letters, vol. 58, No. 25, Jun. 24, 1991, pp. 2942–2944.

Zingg, et al., "Three-Dimensional Stacked MOS Transistors by Localized Silicon Epitaxial Overgrowth," IEEE Transactions on Electron Devices, vol. 37, No. 6, Jun. 1990, pp. 1452–1461.

Chang, et al., "500–V n-Channel Insulated-Gate Bipolar Transistor with a Trench Gate Structure," IEEE Transactions on Electron Devices, vol. 36, No. 9, Sep. 1990, pp. 1824–1829.

Shanai, et al., "High-Performance Vertical-Power DMOSFETs with Selectively Silicided Gate and Source Regions," IEEE Electron Device Letters, vol. 10, No. 4, Apr. 1989, pp. 153–155.

Siekkinen, et al., "Selective Epitaxial Growth Silicon Bipolar Transistors for Material Characterization," IEEE Transactions on Electron Devices, vol. 35, No. 10, Oct. 1988, pp. 1640–1644.

Ueda, et al., "Deep-Trench Power MOSFET with An Ron Area Product of 160 mΩ·mm²," IEDM 86, 28.2, pp. 638–641.

Simpson, et al., "Analysis of the Lateral Insulated Gate Transistor," IEDM 85, 30.5, pp. 740–743.

Sze, "Physics of Semiconductors Devices," 2nd Ed., John Wiley & Sons, Inc., 1981.

Colak, et al., "Lateral DMOS Power Transistor Design," IEEE Electron Device Letters, vol. EDL-1, No. 4, Apr. 1980, pp. 51–53.

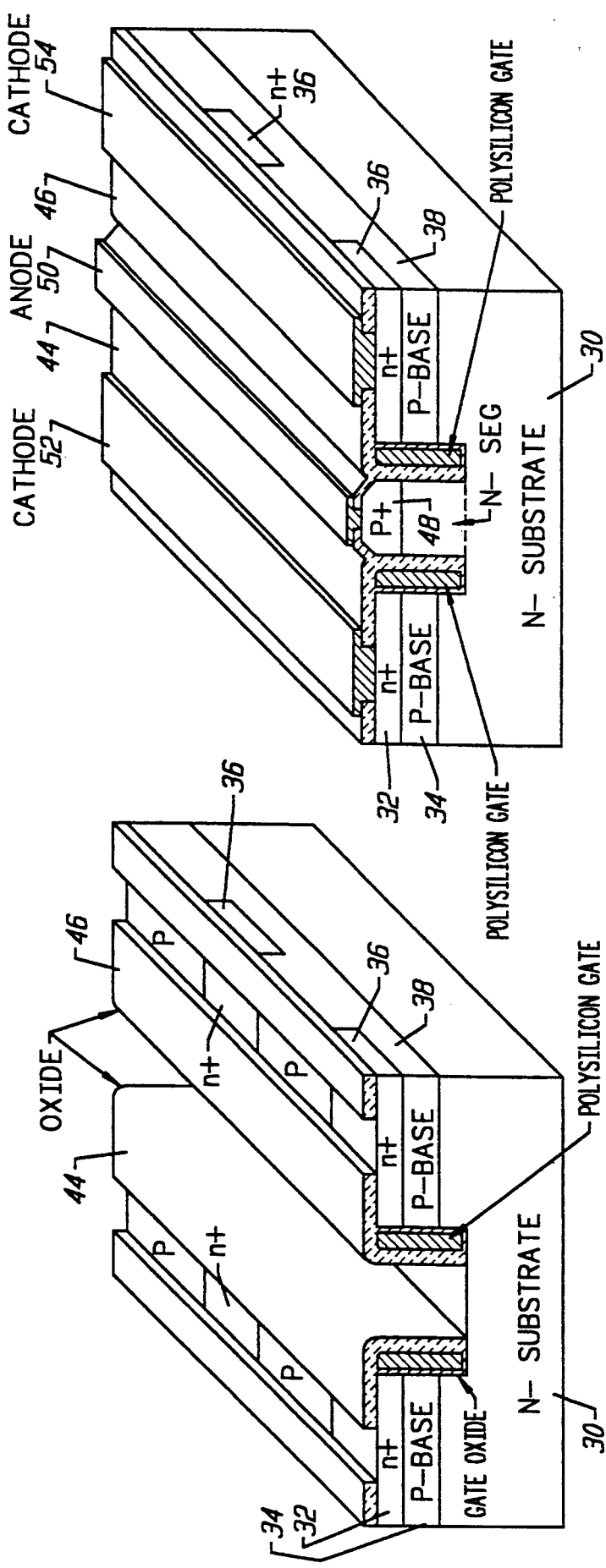

INTEGRABLE MOS AND IGBT DEVICES HAVING TRENCH GATE STRUCTURE

BACKGROUND OF THE INVENTION

This invention relates generally to semiconductor field effect power devices having insulated control gates, and more particularly, the invention relates to such devices which are readily integrable in semiconductor integrated circuits and methods of making the same.

Traditionally, power semiconductor devices with large current carrying capability have been fabricated with vertical current flow from one major surface of a semiconductor chip to an opposing major surface.

FIG. 1 is a section view of a prior art power MOSFET structure which uses double diffusion techniques to achieve very short, well-controlled channel lengths. Two N+ diffused regions 10 formed in respective P-doped diffused regions 12 form the source regions which are contacted by the contacts 14. A gate contact 16 is provided on gate insulation 18 over the channel regions in P regions 12. An N− epitaxial drift region 20 and an N+ substrate region 22 form the drain of the power MOSFET. A drain contact 24 is provided on an opposing surface of the chip in contact with the N+ region 22. Such a device is disclosed in U.S. Pat. No. 4,072,975, issued Feb. 7, 1978, for example.

FIG. 2 is a section view of a prior art insulated gate bipolar transistor (IGBT) which is very similar to the power MOSFET of FIG. 1, and like elements have the same reference numerals. However, the IGBT has a heavily doped P+ type region 24 which functions as an anode and forms a PN junction with the lightly-doped N− drift region 20. The P+ region replaces the N+ drain region 22 of the conventional power MOSFET illustrated in FIG. 1. Such a device is disclosed in U.S. Reissue Pat. No. 33,209 and in U.S. Pat. No. 4,364,073.

The vertical device designs of these prior art devices result in significant reduction in chip area compared to lateral devices and also minimize electric field crowding. Unfortunately, the placement of one large current carrying terminal on the back side of the chip, characteristic of vertical device designs, limits the circuit designer to one power device per chip. Lateral power devices, on the other hand, are not limited to one device per chip because all of their contacts are on the top surface. Lateral power devices are used in smart power applications where a number of power devices are integrated on the same chip with low power control and detection circuits. However, lateral devices generally possess very large drift regions resulting in inefficient utilization of chip area.

The present invention is directed to semiconductor field effect power devices such as the power MOSFET and the IGBT which are readily integrable in a semiconductor integrated circuit.

SUMMARY OF THE INVENTION

In accordance with the invention, semiconductor power devices are provided which combine the flexibility of surface contacts found in lateral power devices with the area saving cellular structure of vertical devices.

A MOSFET device in accordance with the invention includes a semiconductor having first and second major opposing surfaces with a first doped region of a first conductivity type therebetween. Second and third doped regions of a second conductivity type are formed in the first doped region and provide channel regions, the second and third doped regions being spaced apart and abutting the first surface. Fourth and fifth doped source regions of the first conductivity type are respectively formed in the second and third doped regions and abut the first surface. Sixth and seventh doped gate regions extend from the first surface into the first region, the sixth region being adjacent to the second and fourth regions and spaced therefrom by an electrically insulative layer (gate oxide), and the seventh region being adjacent to the third and fifth region and spaced therefrom by an insulative layer (gate oxide). The first doped region extends toward the first surface between the sixth and seventh regions and is separated therefrom by an electrically insulative layer of variable thickness (blocking voltage oxide). Advantageously, the variable thickness blocking voltage oxide can be tailored for the desired voltage handled by the device and is independent of the gate oxide thickness. An eighth doped drain region is formed in the first doped region between the sixth and seventh regions and abuts the first surface, the eighth doped region having the same conductivity type as the first region. Thus, contacts to the source, drain, and gate can all be provided on the first surface of the semiconductor body.

An insulated gate bipolar transistor (IGBT) device in accordance with the invention has a structure similar to that of the MOSFET device except the eighth doped region and the first doped region between the sixth an seventh regions have opposite conductivity type dopant therein with the eighth region functioning as the anode of the IGBT. The second and third doped regions which functioned as the source in the MOSFET now function as cathode elements in the IGBT. Again, the sixth and seventh doped regions extending from the first surface into the first region function as vertical gates for the IGBT. Contacts to the anode, cathode, and gate can be provided on the first surface of the semiconductor body.

In fabricating the power devices in accordance with the invention, the second, third, fourth, and fifth doped regions are formed by etching through two surface regions thereby forming a trench which separates the second and fourth regions from the third and fifth regions. An electrically insulative layer such as thermally grown silicon oxide is formed on the surface of the trench as a gate oxide, and then doped polysilicon or other conductive material is deposited to form the gate elements. Another electrically insulative layer of variable thickness (blocking voltage oxide) is then formed on the surfaces of the gate by thermal oxidation, for example, and then the trench is filled by epitaxially growing semiconductor material selectively from the semiconductor body. The epitaxial material is suitably doped to provide the drain of a MOSFET or the anode of an IGBT.

The invention and objects and features thereof will be more readily apparent from the following detailed description and appended claims when taken with the drawing.

BRIEF DESCRIPTION OF THE DRAWING

FIGS. 6A-6C are isometric views of a three-dimensional IGBT at various stages of fabrication.

DETAILED DESCRIPTION OF ILLUSTRATIVE EMBODIMENTS

Figure 1:
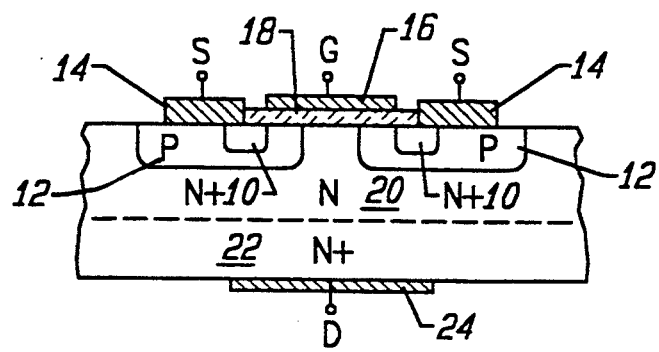
FIG. 1 is a section view of a power MOSFET device in accordance with the prior art.
Figure 2:
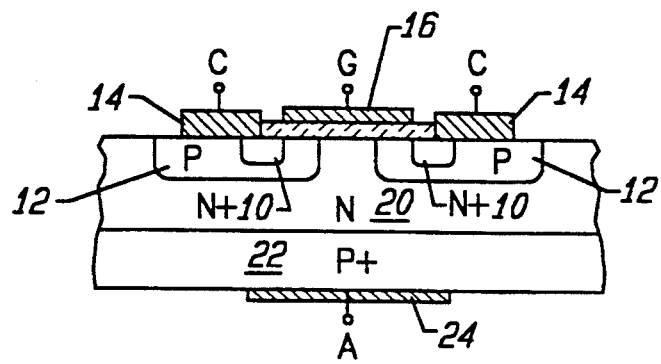
FIG. 2 is a section view of an IGBT device in accordance with the prior art.
Figure 3:
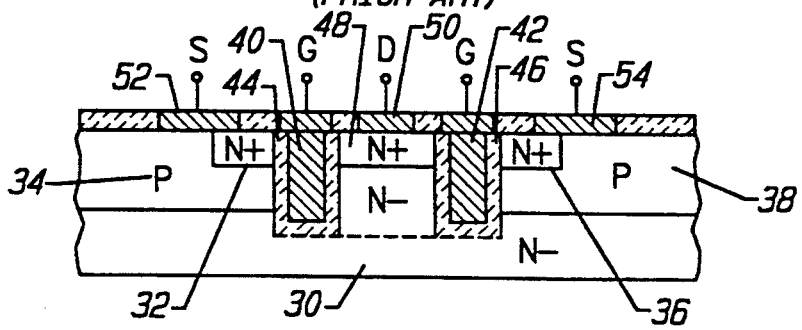
FIG. 3 is a section view of a MOSFET device in accordance with the invention.
Figure 4:
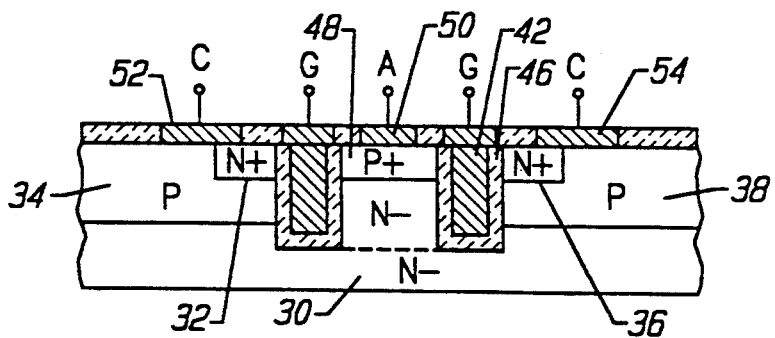
FIG. 4 is a section view of an IGBT device in accordance with the invention.

FIG. 3 is a section view of a power MOSFET device in accordance with one embodiment of the invention, and FIG. 4 is a section view of an IGBT device in accordance with one embodiment of the invention. The two devices are similar in structure and like elements have the same reference numeral.

Referring to FIG. 3, the device is fabricated in an N− doped silicon substrate 30. The source and channel regions of the device are formed by double diffused regions including N+ surface region 32 formed in a P doped region 34, and N+ region 36 formed in a P region 38. Two doped polysilicon gates 40, 42 extend vertically from the surface of the semiconductor wafer into the N− region 30. Gate electrode 40 is adjacent to N+ region 32 and P region 34 and separated therefrom by silicon oxide insulation 44 (gate oxide), and gate electrode 42 is adjacent to the N+ region 36 and P region 38 and separated therefrom by silicon oxide 46 (gate oxide). The N− region 30 extends towards the surface between the gate electrodes 40, 42 and is insulated therefrom by the variable thickness silicon oxide 44, 46 (blocking voltage oxide) which respectively envelope the gate electrodes 40, 42. In the power MOSFET device, an N+ surface region 48 is formed in the N− region 30 between the gate electrodes and functions as the drain of the MOSFET. A drain contact 50 is made thereto. N+ regions 32, 36 function as the source regions of the device, and contacts 52 and 54 on the surface of the device contact the N+ regions 32, 36 as well as the P doped regions 34, 38. The P doped regions can have more heavily doped P+ regions to facilitate ohmic contact thereto, as will be described hereinbelow with reference to FIGS. 5A-5F. Thus, the device has the advantages of all contacts formed on one surface of the device, yet current flow is in a vertical direction.

As noted above, the section view of the IGBT of FIG. 4 is similar to the MOSFET device of FIG. 3 except the region 48 is doped with P type dopants and forms an anode of the IGBT. Cathode contacts are made to the N+ regions 32, 36 with the contacts also contacting the P doped regions 34, 38. Again, all contacts are on one surface of the device, yet the current flow is vertical as in a conventional power semiconductor device.

Figure 5A:
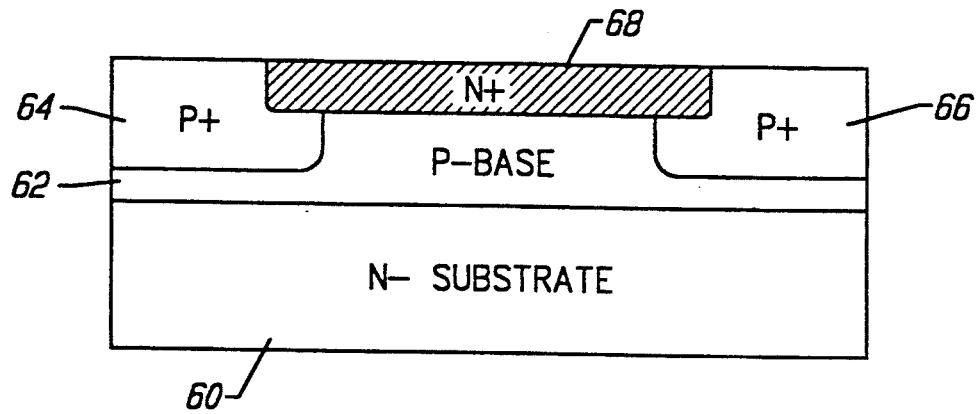
FIGS. 5A-5F are section views illustrating steps in fabricating the device of FIG. 4.
Figure 5B:
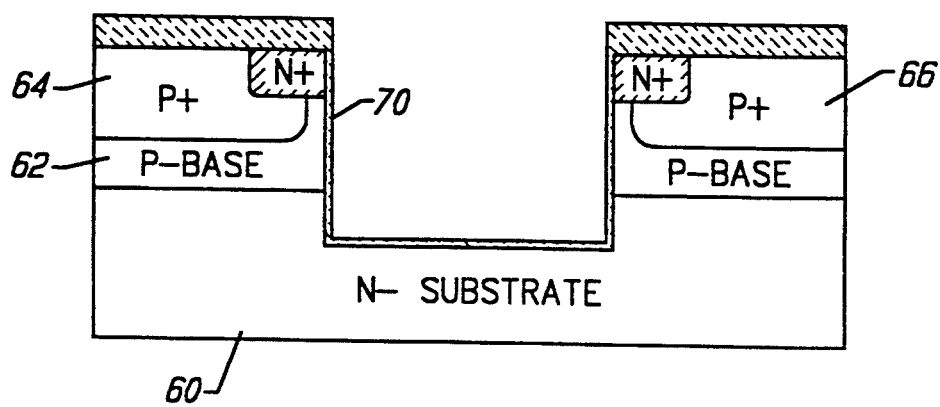

FIGS. 5A-5F are section views illustrating steps in fabricating the IGBT device of FIG. 4 in accordance with one embodiment of the invention. Initially, as shown in FIG. 5A, an N− substrate 60 has a P− region 62 formed therein with spaced apart P+ region 64, 66 formed in the P− region 62. A shallower N+ region 68 is then formed in the surface of the device extending from the P+ region 64 to the P+ region 66.

Thereafter, as shown in FIG. 6B, a 4 micron deep trench is formed in the semiconductor substrate by reactive ion etching with the trench extending from the N+ region 68 through the P− region 62 to the N− region 60. A thin 1000 Å gate silicon oxide layer 70 is then thermally grown on the surface of the trench.

Figure 5C:
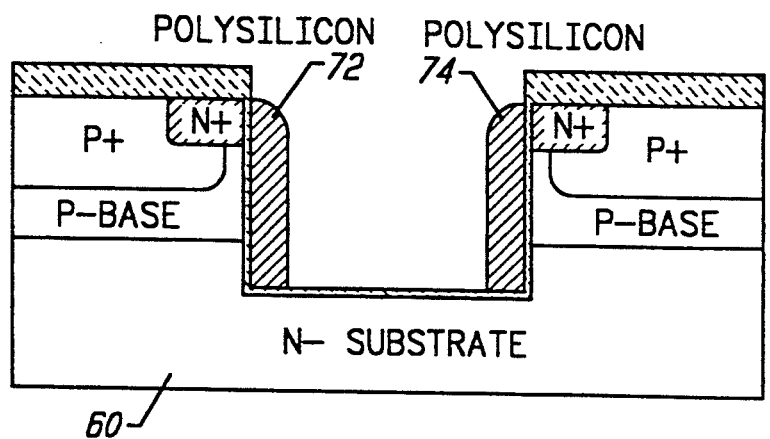
Figure 5D:
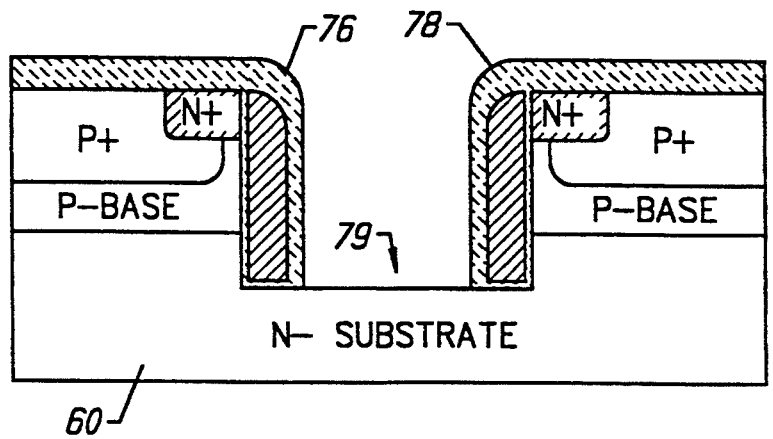

Next, 5000 Å of polysilicon is deposited in the trench and doped with phosphorous and then the polysilicon material is etched using reactive ion etching to form the sidewall gate electrodes 72, 74, as shown in FIG. 5C. Thereafter, as shown in FIG. 5D, the sidewall polysilicon gates are thermally oxidized to form a 3000 Å silicon oxide layer 76, 78 on its surface. In forming the oxide 76, 78, 1500 Å of polysilicon is first deposited and then totally consumed by a 3000 Å thermal oxidation. The oxide layer is then etched using reactive ion etching to form a self-aligned seed window 79 at the bottom of the trench.

Figure 5E:
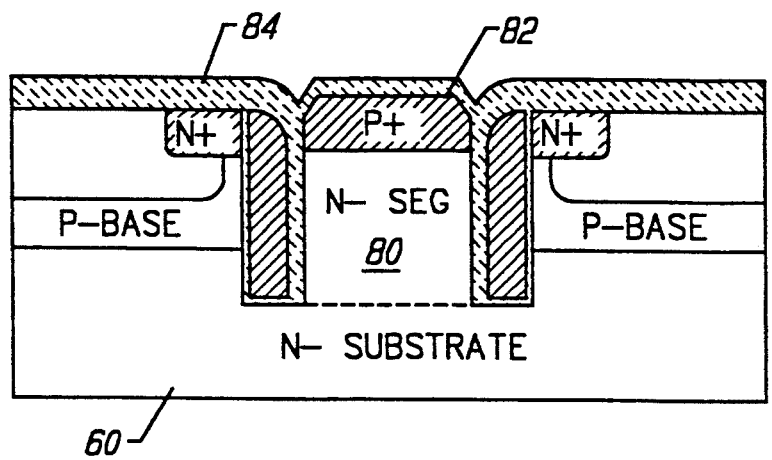
Figure 5F:
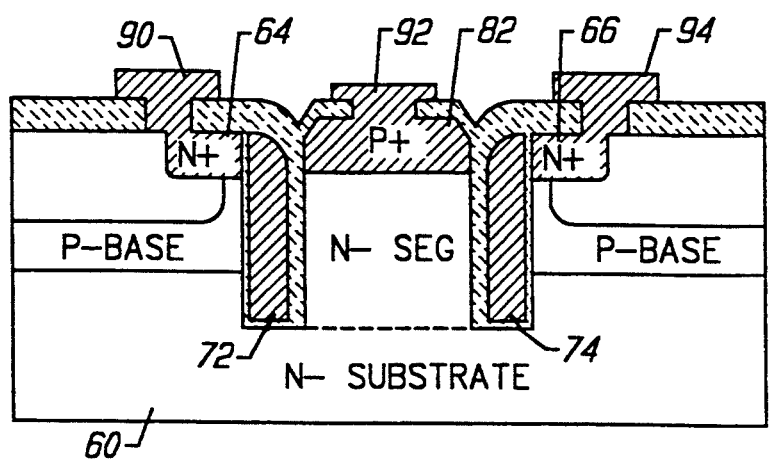

In FIG. 5E, the trench is filled by selective epitaxial silicon grown from the bottom of the trench using the exposed silicon substrate as the seed. The epitaxial silicon is lightly doped N type (N−), and then the anode region is formed in a surface portion of the epitaxial silicon by implanting boron to form the P+ region 82. An oxide layer 84 is formed over the top surface of the semiconductor device which is then selectively etched to form contact openings to the P+ anode 82, the N+ cathodes 64, 66. Contacts 90, 92, and 94 are then formed as shown in FIG. 5F. Contacts to gate electrodes 72, 74 are made at the end of the device (not shown).

Figure 6A:
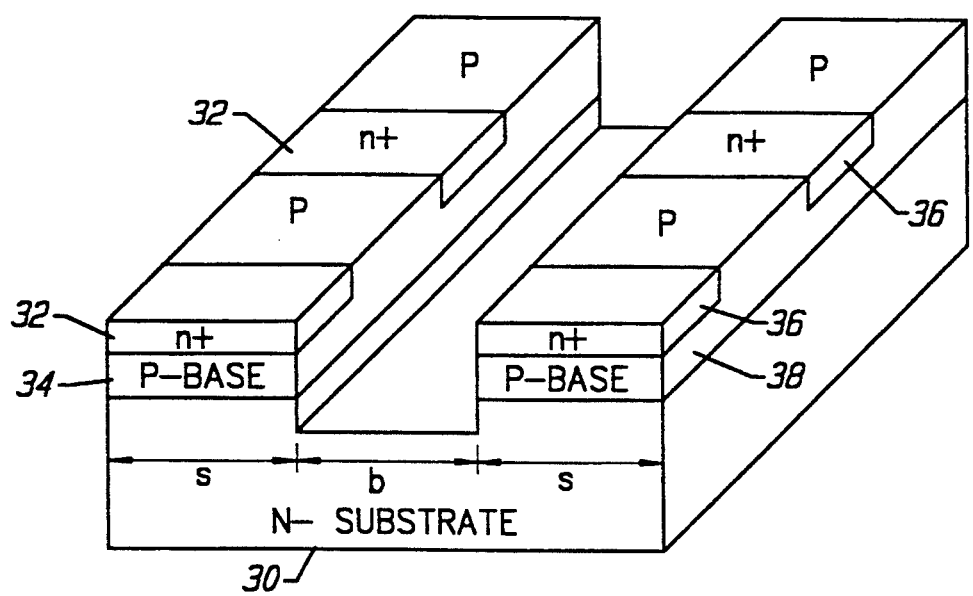

FIGS. 6A-6C are isometric views of the IGBT illustrating its cellular structure. The reference numerals in FIG. 4 are used in FIG. 6. In FIG. 6A the trench is formed by reactive ion etching of the semiconductor substrate, such as illustrated in the section view of FIG. 5B.

FIG. 6B illustrates the structure after formation of the polysilicon sidewall gates and oxide layers, as shown in the section view of FIG. 5D.

FIG. 6C illustrates the completed device with the ohmic contacts made to the anode and cathodes, similar to the section view of FIG. 5F.

There have been described power semiconductor devices having vertical current flow but which are fully integrable in an integrated circuit with all ohmic contacts on one surface of the device. A trench gate structure permits vertical gates relative to horizontal major surfaces of the device with the trench filled with epitaxial semiconductor material for fabrication of a MOSFET drain or an IGBT anode. The cellular structure increases packing density and reduces on-resistance per unit area. The parasitic JFET resistance found in conventional vertical IGBT devices is eliminated. The device is readily integrated with lower power devices using junction or dielectric isolation. A process for fabricating the power devices in accordance with the invention has been illustrated with reference to a preferred embodiment. However, while the invention has been described with reference to specific embodiments, the descriptions are illustrative of the invention and are not to be construed as limiting the invention. Various modifications and applications may occur to those skilled in the art without departing from the true spirit and scope of the invention as defined by the appended claims.

What is claimed:

1. A power semiconductor device which is integrable in an integrated circuit comprising a semiconductor body having first and second major opposing surfaces with a first doped region of a first conductivity type therebetween, second and third doped regions of a second conductivity type formed in said first doped region, said second and third doped regions being spaced apart and abutting said first surface, fourth and fifth doped regions of said first conductivity type respectively formed in said second and third doped regions and abutting said first surface, sixth and seventh doped regions extending from said first surface into said first region, said sixth region being adjacent to said second and fourth regions and spaced therefrom by an electrically insulative gate layer, said seventh region being adjacent to said third and fifth regions and spaced therefrom by an electrically insulative gate layer, said first doped region extending toward said first surface between said sixth and seventh regions and separated from said sixth and seventh regions by an electrically insulative layer of suitable thickness for voltage blocking, and an eighth doped region in said first doped region between said sixth and seventh regions and abutting said first surface.

2. The power semiconductor device as defined by claim 1 and further including an ohmic contact to said second and fourth regions, an ohmic contact to said third and fifth regions, and an ohmic contact to said sixth and seventh regions.

3. The power semiconductor device as defined by claim 1 wherein said eighth doped region is of said first conductivity type, said device being a power MOSFET.

4. The power semiconductor device as defined by claim 3 wherein said first conductivity type is N type and said second conductivity type is P type.

5. The power semiconductor device as defined by claim 1 wherein said sixth and seventh doped regions are of first conductivity type.

6. The power semiconductor device as defined by claim 1 wherein said eighth doped region is of second conductivity type, said device being an IGBT.

7. The power semiconductor device as defined by claim 6 wherein said first conductivity type is N type and said second conductivity type is P type.

8. The power semiconductor device as defined by claim 7 wherein said sixth and seventh regions are of first conductivity type.

9. A power MOSFET device comprising a semiconductor body having first and second major opposing surfaces with a first doped region of a first conductivity type therebetween, first and second double diffused regions formed in said first doped region, said first and second double diffused regions being spaced apart and abutting said first surface, first and second gate electrodes extending from said first surface into said first doped region, said first gate electrode being adjacent to said first double diffused region and spaced therefrom by an electrically insulative layer, said second gate electrode layer being adjacent to said second double diffused region and spaced therefrom by an electrically insulative layer, said first region extending to said first surface between said first and second gate electrodes and separated therefrom by an electrically insulative layer of suitable thickness for voltage blocking, and a drain region of said first conductivity type in said first doped region between said gate electrodes and abutting said first surface, said first and second double diffused regions comprising source and channel regions of said device.

10. The power MOSFET device as defined by claim 9 wherein said drain region has a higher dopant concentration than said first region.

11. The power MOSFET device as defined by claim 10 and further including an ohmic contact to said source regions, an ohmic contact to said drain regions, and an ohmic contact to said gate electrodes.

12. The power MOSFET device as defined by claim 11 wherein said first conductivity type is N type and said second conductivity type is P type.

13. An insulated gate bipolar transistor (IGBT) device comprising a semiconductor body having first and second major opposing surfaces with a first doped region of a first conductivity type therebetween, first and second double diffused regions formed in said first doped region, said first and second double diffused regions being spaced apart and abutting said first surface, first and second gate electrodes extending from said first region into said first doped region, said first gate electrode being adjacent to said first double diffused region and spaced therefrom by an electrically insulative layer, said second gate electrode being adjacent to said second double diffused region and spaced therefrom by an electrically insulative layer, said first region extending towards said first surface between said first and second gate electrodes and separated from said first and second gate electrodes by an electrically insulative layer of suitable thickness for voltage blocking, and a doped region of a second conductivity type in said first doped region between said first and second gate electrodes and functioning as an anode, said first and second double diffused regions functioning as cathodes and channel regions of said device.

14. The IGBT device as defined by claim 10 and further including an ohmic contact to said anode, an ohmic contact to said cathode, and an ohmic contact to said gate.

15. The IGBT device as defined by claim 14 wherein said first conductivity type is N type and said second conductivity type is P type.

16. A method of fabricating a power semiconductor device which is integrable in an integrated circuit comprising the steps of a) providing a semiconductor body having first and second major opposing surfaces with a first doped region of a first conductivity type therebetween, b) forming a first surface region in said first doped region with dopant of a second conductivity type, said surface region abutting said first surface, c) forming a second surface region of said first conductivity type in said first surface region, said second surface region abutting said first surface, d) forming a trench through said first surface region, said second surface region, and into said first doped region, said trench having exposed sidewalls and a bottom surface, e) forming electrically insulative layers on said sidewalls, f) forming conductive layers over said electrically insulative layers on said sidewalls, g) forming electrically insulative layers of suitable thickness for voltage blocking on said conductive layers, h) filling said trench with semiconductor material selectively epitaxially grown said bottom surface, and i) doping a surface portion of said semiconductor material in said trench.

17. The method as defined by claim 16 wherein said conductive layers comprise doped polysilicon.

18. The method as defined by claim 17 and further including forming contacts to said first and second surface regions, forming contacts to said surface portion of said semiconductor material between said doped polysilicon layers, and forming a contact to said doped polysilicon layers.

19. The method as defined by claim 16 wherein step i) includes doping a surface portion of said semiconductor material in said trench with dopant of said first conductivity type, said device being a MOSFET.

20. The method as defined by claim 16 wherein step i) includes doping a surface portion of said semiconductor material in said trench with dopant of said second conductivity type, said device being an IGBT.

21. The method as defined by claim 16 and further including after step b) the step of doping a portion of said first surface region with dopant of said second conductivity type to increase the dopant concentration.

22. The method as defined by claim 16 wherein step d) includes reactive ion etching.

23. The method as defined by claim 22 wherein steps e) and g) form thermally grown silicon oxide of variable thickness.

24. A microelectronic gated device comprising a monocrystalline semiconductor substrate having a trench therein at one face thereof, said trench including a trench sidewall;

a relatively thin first insulating layer on said trench sidewall for gate oxide;

a gate electrode on said relatively thin first insulating layer;

a relatively thick second insulating layer on said gate electrode for voltage blocking;

a monocrystalline semiconductor region on said relatively thick second insulating layer, and extending from said substrate to said one face;

first contact means for electrically contacting said monocrystalline semiconductor region at said one face; and second contact means for electrically contacting said monocrystalline semiconductor substrate at said one face.

* * * * *